United States Patent
Ohkura et al.

(10) Patent No.: US 8,716,148 B2
(45) Date of Patent: May 6, 2014

(54) SEMICONDUCTOR DEVICE MANUFACTURING METHOD

(75) Inventors: Yoshiyuki Ohkura, Yokohama (JP); Toshiki Mori, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 228 days.

(21) Appl. No.: 13/070,740

(22) Filed: Mar. 24, 2011

(65) Prior Publication Data

US 2011/0312191 A1    Dec. 22, 2011

(30) Foreign Application Priority Data

Jun. 18, 2010  (JP) .................. 2010-139018

(51) Int. Cl.
*H01L 21/311*  (2006.01)
*H01L 21/3205*  (2006.01)

(52) U.S. Cl.
USPC .................................. 438/758; 257/E21.241

(58) Field of Classification Search
USPC .................................. 438/758; 257/E21.241
See application file for complete search history.

(56) References Cited

U.S. PATENT DOCUMENTS

| | | | |
|---|---|---|---|
| 6,475,930 B1 | 11/2002 | Junker et al. | |
| 7,217,654 B2* | 5/2007 | Nagahara et al. | 438/637 |
| 7,288,205 B2* | 10/2007 | Lakshmanan et al. | 216/67 |
| 7,498,520 B2* | 3/2009 | Osaka et al. | 174/250 |
| 7,563,705 B2* | 7/2009 | Tonegawa et al. | 438/622 |
| 7,944,054 B2* | 5/2011 | Matsunaga | 257/758 |
| 2003/0077857 A1* | 4/2003 | Xia et al. | 438/200 |
| 2005/0124168 A1* | 6/2005 | Nagahara et al. | 438/745 |
| 2005/0250346 A1* | 11/2005 | Schmitt | 438/778 |
| 2006/0006140 A1* | 1/2006 | Lakshmanan et al. | 216/67 |
| 2006/0160352 A1 | 7/2006 | Matsushita et al. | |
| 2006/0183055 A1 | 8/2006 | O'Neill et al. | |
| 2006/0205232 A1* | 9/2006 | Li et al. | 438/778 |
| 2007/0098890 A1 | 5/2007 | Sasaki et al. | |
| 2007/0232058 A1 | 10/2007 | Ozaki et al. | |
| 2007/0299239 A1* | 12/2007 | Weigel et al. | 528/349 |
| 2008/0042077 A1* | 2/2008 | Schmitt | 250/492.2 |
| 2008/0132087 A1* | 6/2008 | Xia et al. | 438/789 |
| 2011/0081776 A1* | 4/2011 | Nomura et al. | 438/666 |
| 2011/0177687 A1* | 7/2011 | Matsunaga | 438/624 |

(Continued)

FOREIGN PATENT DOCUMENTS

| | | |
|---|---|---|
| JP | 2001-257207 A | 9/2001 |
| JP | 2005-175085 A | 6/2005 |

(Continued)

OTHER PUBLICATIONS

Ushio, Jiro et al "Ultraviolet-Curing Mechanism of Porous-SiOC," Japanese Journal of Applied Physics, Apr. 20, 2007, vol. 46 No. 17, pp. L405-L407.

(Continued)

*Primary Examiner* — George Fourson, III
(74) *Attorney, Agent, or Firm* — Westerman, Hattori, Daniels & Adrian, LLP

(57) ABSTRACT

A semiconductor device manufacturing method includes forming an insulation film containing silicon, oxygen and carbon over a semiconductor substrate by chemical vapor deposition; making UV cure on the insulation film being heated at a temperature of 350° C. or below after the forming the insulation film; and making helium plasma processing on the insulation film after the UV cure.

19 Claims, 14 Drawing Sheets

(56) References Cited

U.S. PATENT DOCUMENTS

| | | | |
|---|---|---|---|
| 2011/0263117 A1* | 10/2011 | Nam et al. | 438/627 |
| 2011/0312191 A1* | 12/2011 | Ohkura et al. | 438/786 |
| 2012/0156890 A1* | 6/2012 | Yim et al. | 438/763 |

FOREIGN PATENT DOCUMENTS

| | | |
|---|---|---|
| JP | 2006-165573 A | 6/2006 |
| JP | 2006-237603 A | 9/2006 |
| JP | 2006-319116 A | 11/2006 |
| JP | 2007-273494 A | 10/2007 |
| JP | 2008-053402 A | 3/2008 |
| JP | 2009-117739 A | 5/2009 |
| JP | 2009-152373 A | 7/2009 |
| WO | 2007/032563 A1 | 3/2007 |

OTHER PUBLICATIONS

Yoneda, K. et al "Impacts of UV Cure for Reliable Porous PECVD SiOC Integration," IEEE IITC 2005, 2005, pp. 220-222.

Nakao, Shin-Ichi et al "UV/EB Cure Mechanism for Porous PECVD/SOD Low-k SiCOH Materials," IEEE IITC 2006, 2006, pp. 66-68.

Nakao Shin-Ichi et al "Paramagnetic Defect Spin Centers in Porous SiOCH Film Investigated Using Electron Spin Resonance," Japanese Journal of Applied Physics, 2007, vol. 46 No. 6A, pp. 3351-3353.

Japanese Office Action dated Aug. 6, 2013, issued in Japanese Patent Application No. 2010-139018, w/English translation of relevant part, p. 1, line 1 to p. 2, line 2.

* cited by examiner

SEMICONDUCTOR DEVICE MANUFACTURING METHOD

CROSS-REFERENCE TO RELATED APPLICATION

This application is based upon and claims the benefit of priority of the prior Japanese Patent Application No. 2010-139018, filed on Jun. 18, 2010, the entire contents of which are incorporated herein by reference.

FIELD

The embodiments discussed herein are related to a semiconductor device manufacturing method.

BACKGROUND

Recently, the frequency of signals of semiconductor devices has become increasing higher, and this makes it important to use low dielectric constant (low-k) materials as a material of the inter-layer insulation films.

As an insulation film having low dielectric constant, SiOC film, for example, is used. A number of voids are formed in the SiOC film, which realizes relatively low relative dielectric constants.

SiOC film is formed by, e.g., CVD (Chemical Vapor Deposition).

The SiOC film formed simply by CVD cannot have sufficient strength and cannot have sufficiently low relative dielectric constant either. UV cure for the purposes of improving the strength and decreasing the relative dielectric constant is made on the inter-layer insulation film of SiOC.

Related reference is as follows:
Japanese Laid-open Patent Publication No. 2005-175085.

SUMMARY

According to an aspect of an embodiment, a semiconductor device manufacturing method includes forming an insulation film containing silicon, oxygen and carbon over a semiconductor substrate by chemical vapor deposition; making UV cure on the insulation film being heated at a temperature of 350° C. or below after the forming the insulation film; and making helium plasma processing on the insulation film after the UV cure.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENT

When UV cure is simply made, the film stress of the inter-layer insulation film much increases, and the film easily peels. Semiconductor devices of sufficiently high reliability cannot be always manufactured.

For example, UV cure is made on an inter-layer insulation film of SiOC with the inter-layer insulation film heated at 400° C., whereby the strength of the inter-layer insulation film can be sufficiently increased, and the relative dielectric constant of the inter-layer insulation film can be also sufficiently decreased. That is, the UV cure at 400° C. sufficiently strengthens the bonds in the inter-layer insulation film, and the inter-layer insulation film can have sufficiently strength. The UV cure at 400° C. discharge unnecessary substances, such as silanol (Si—OH) groups, etc. from the inter-layer insulation film to the outside of the inter-layer insulation film, and the inter-layer insulation film can have sufficiently low relative dielectric constant.

However, when the UV cure is made with the inter-layer insulation film heated at 400° C., the film stress of the inter-layer insulation film becomes much large. Such large stress will be generated because the inter-layer insulation film is cooled after the bonds in the inter-layer insulation film having been strengthened at 400° C., and the inter-layer insulation film and other constituent elements are different in the coefficient of thermal expansion.

When the heating temperature of the UV cure is lowered, the film stress of the inter-layer insulation film accordingly lowers. However, the heating temperature of the UV cure is lowered, unnecessary substances, such as silanol groups, etc., are not easily removed from the inter-layer insulation film, and the relative dielectric constant does not sufficiently lower.

The inventors of the present application have made earnest studies and have obtained the idea that as will be described later, He (Helium) plasma processing is made after the UV cure, whereby even when the heating temperature of the UV cure is set relatively low, the relative dielectric constant of the inter-layer insulation film can be sufficiently lowered.

Preferred embodiments of the present invention will be explained with reference to accompanying drawings.

[a] One Embodiment

The semiconductor device according to one embodiment will be described with reference to FIGS. 1A to 14. FIGS. 1A to 14 are cross-sectional views of a semiconductor device in the steps of the semiconductor device manufacturing method according to the present embodiment, which illustrate the method.

Figure 1A:
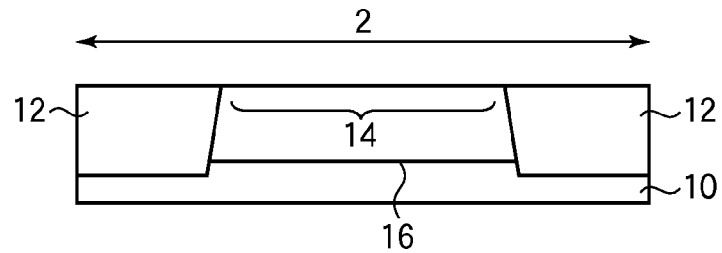
FIGS. 1A to 11 are cross-sectional views of a semiconductor device in the steps of the semiconductor device manufacturing method according to one embodiment, which illustrate the method.

First, device isolation regions 12 are formed in a semiconductor substrate 10 by, e.g., STI (Shallow Trench Isolation) (see FIG. 1A). The semiconductor device 10 is, e.g., an N-type or a P-type silicon substrate. As the material of the isolation regions 12, silicon oxide film, for example, is used. The semiconductor substrate 10 may be SOI (Semiconductor On Insulator) substrate. The device isolation regions 12 may be formed by LOCOS (LOCal Oxidation of Silicon). Thus, the device regions 14 are defined by the device isolation regions 12.

Then, a photoresist film (not illustrated) is formed on the entire surface by, e.g., spin coat method.

Then, by photolithography, an opening (not illustrated) for opening an NMOS transistors-to-be-formed region 2 is formed.

Then, with the photoresist film as the mask, a P-type dopant impurity is implanted into the semiconductor substrate 10 by, e.g., ion implantation to thereby form a P-type well 16. The P-type dopant impurity is, e.g., B (boron).

Then, the photoresist film is removed by, e.g., asking.

In a PMOS transistors-to-be-formed region not illustrated, an N-type well (not illustrated) is formed, and in the N-type well, PMOS transistors (not illustrated) are formed in later steps. In the present embodiment, the NMOS transistors-to-be-formed region 2 will be mainly described, and the description about the PMOS transistors-to-be-formed region will be omitted.

Then, on the surface of the semiconductor substrate 10, a gate insulation film 18 of a silicon oxide film of, e.g., a 1.5 nm-film thickness is formed by, e.g., dry thermal oxidation.

Next, on the entire surface, a polysilicon film of, e.g., a 100 nm-film thickness is formed by, e.g., CVD (Chemical Vapor Deposition).

Then, on the entire surface, a photoresist film (not illustrated) is formed by, e.g., spin coating.

Next, by photolithography, an opening (not illustrated) for opening the NMOS transistors-to-be-formed region 2 is formed in the photoresist film.

Next, with the photoresist film as the mask, an N-type dopant impurity is implanted into the polysilicon film by, e.g., ion implantation. The N-type dopant impurity is, e.g., phosphorus. Thus, the polysilicon film in the NMOS transistors-to-be-formed region 2 becomes N-type type.

Hereafter, the photoresist film is removed by, e.g., ashing.

Next, thermal processing for activating the dopant impurity is made by, e.g., RTA (Rapid Thermal Annealing).

Figure 1B:
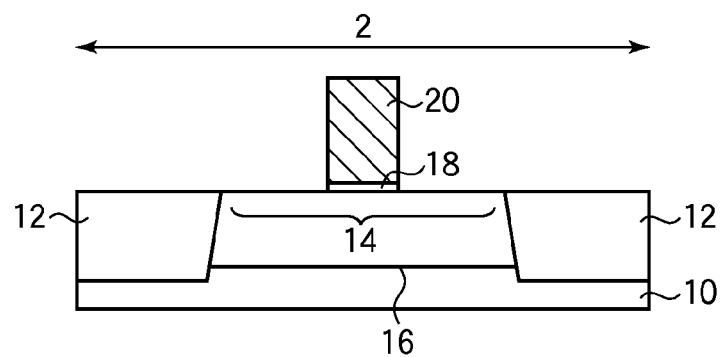

Then, by photolithography, the polysilicon film is patterned to thereby form gate electrodes 20 of polysilicon (see FIG. 1B). The gate length is, e.g., about 32 nm.

Next, on the entire surface, a photoresist film (not illustrated) is formed by, e.g., spin coating.

Then, by photolithography, an opening for opening the NMOS transistors-to-be-formed region 2 is formed in the photoresist film.

Figure 1C:
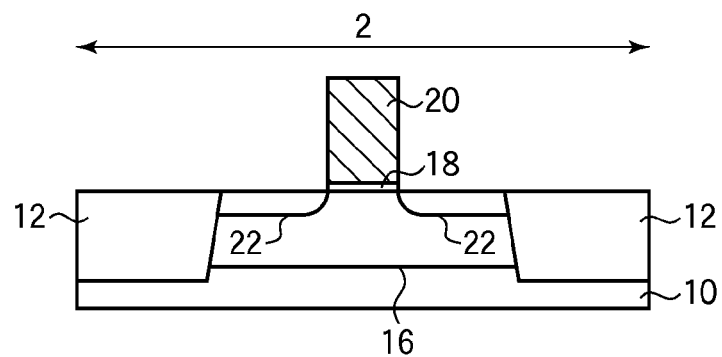

Next, with the photoresist film and the gate electrodes 20 as the mask, an N-type dopant impurity is implanted by, e.g., ion implantation to thereby form N-type extension regions 22 in the semiconductor substrate 10 on both sides of the gate electrodes 20 (see FIG. 1C). The N-type dopant impurity is, e.g., phosphorus or arsenic. The acceleration energy is, e.g., about 7 keV. The dose is, e.g., about $7.0 \times 10^{14}$ cm$^{-2}$.

Hereafter, the photoresist film is removed by, e.g., ashing.

Next, on the entire surface, a silicon oxide film of, e.g., an 8 nm-film thickness is formed by, e.g., CVD.

Figure 1D:
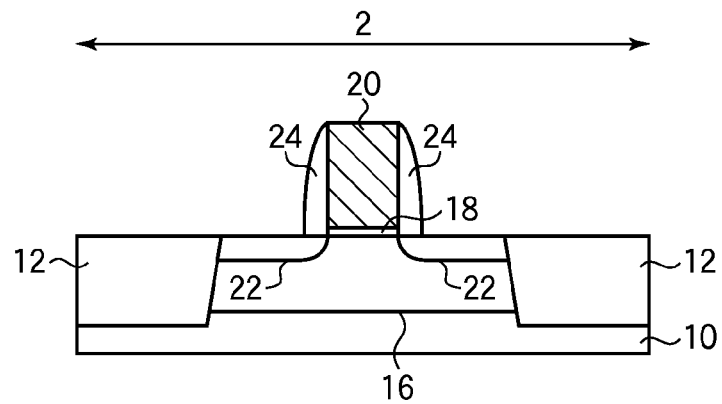

Then, the silicon oxide film is anisotropically etched to form a sidewall insulation film 24 of silicon oxide film on the side walls of the gate electrodes 20 (see FIG. 1D).

Next, on the entire surface, a photoresist film (not illustrated) is formed by, e.g., spin coating.

Then, by photolithography, an opening (not illustrated) for opening the NMOS transistors-to-be-formed region 2 is formed.

Next, with the gate electrodes 20 with the sidewall insulation film 24 formed on, and the photoresist film as the mask, an N-type dopant impurity is implanted into the semiconductor substrate 10. The N-type dopant impurity is, e.g., arsenic (As). The acceleration energy is, e.g., about 12 keV. The dose is, e.g., about $2.0 \times 10^{15}$ cm$^{-2}$. Thus, N-type impurity regions 26 forming the deep regions of the extension source/drain structure are formed (see FIG. 2A).

Hereafter, the photoresist film is removed by, e.g., ashing.

Then, thermal processing for activating the dopant impurity is made by, e.g., RTA (Rapid Thermal Annealing). Thus, the extension regions 22 and the impurity regions 26 form the source/drain diffused layers 28 of the extension source/drain structure (see FIG. 2A).

Next, on the entire surface, a refractory metal film of, e.g., an about 20 nm-film thickness is formed by, e.g., sputtering. The refractory metal film is, e.g., nickel film.

Then, by thermal processing, the silicon in the surface of the semiconductor substrate 10 and the nickel in the refractory metal film are reacted with each other while the silicon in the surfaces of the gate electrodes 20 and the nickel in the refractory metal film are reacted with each other.

Next, that of the refractory metal film, which has not reacted is etched off. Thus, a silicide film 30 of nickel silicide is formed on the source/drain regions diffused layer 28 and on the gate electrodes 20, respectively (see FIG. 2B). The silicide film 30 on the source/drain diffused layers 28 functions as the source/drain electrodes.

Thus, transistor (NMOS transistor) 32 including the gate electrode 20 and the source/drain diffused layer 28 is formed.

Figure 2A:
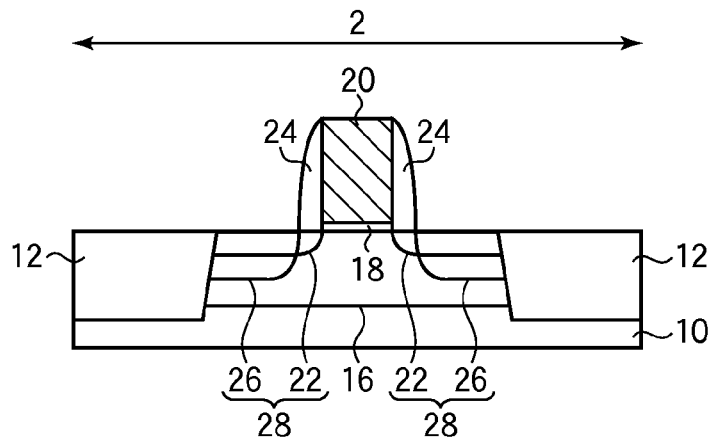
Figure 2B:
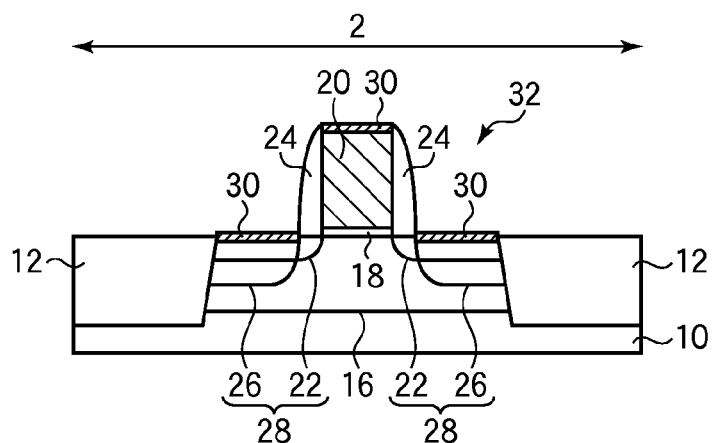
Figure 2C:
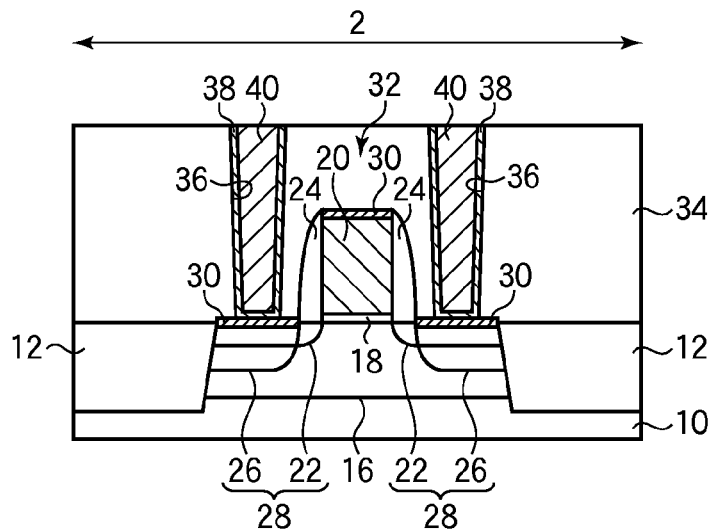

Next, on the entire surface, an inter-layer insulation film 34 of a PSG (Phospho Silicate Glass) film of, e.g., a 600 nm-film thickness is formed by, e.g., CVD (see FIG. 2C).

Then, the surface of the inter-layer insulation film 34 is planarized by, e.g., CMP (Chemical Mechanical Polishing).

Next, by photolithography, contact holes 36 are formed in the inter-layer insulation film 34 down to the source/drain electrodes 30.

Then, on the entire surface, a Ti film of, e.g., a 7 nm-film thickness and a TiN film of, e.g., a 2 nm-film thickness are sequentially formed by, e.g., sputtering. Thus, a base metal film (adhesion film, barrier metal film) 38 of the Ti film and the TiN film are formed.

Next, on the entire surface, a conduction film 40 of, e.g., tungsten is formed by, e.g., CVD. The film thickness of the conduction film 40 is so set that the conduction film 40 sufficiently fills the contact holes 36.

Then, by, e.g., CMP, the tungsten film 40 and the base metal film 38 are polished until the surface of the inter-layer insulation film 34 is exposed. Thus, conductor plugs 40 of, e.g., tungsten are buried in the contact holes 36 (see FIG. 2C).

Figure 3A:
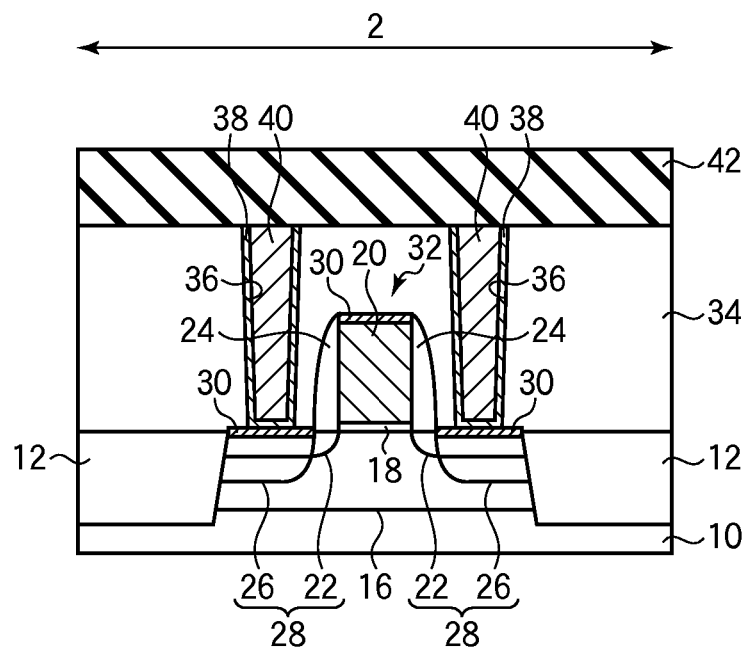

Next, on the entire surface, an inter-layer insulation film 42 of, e.g., a 50 to 200 nm-film thickness is formed by, e.g., plasma CVD (see FIG. 3A). The inter-layer insulation film 42 is formed of a low dielectric constant (low-k) material. Specifically, as the inter-layer insulation film 42, a film containing silicon, oxygen and carbon is formed. More specifically, as the inter-layer insulation film 42, SiOC film is formed. The inter-layer insulation film 42 is formed as exemplified below. The gas to be fed into the film forming chamber is, e.g., TMSA (Trimethylsilylacetylene) gas, $O_2$ gas and $CO_2$ gas. The flow rate of the TMSA gas is set at, e.g., about 3 sccm. The flow rate of the $O_2$ gas is set at, e.g., about 200 sccm. The flow rate of the $CO_2$ gas is set at, e.g., about 5000 sccm. The pressure inside the film forming chamber is set at, e.g., about 10 mTorr. The substrate temperature is set at, e.g., about 400° C. Thus, the inter-layer insulation film 42 is formed.

Figure 3B:
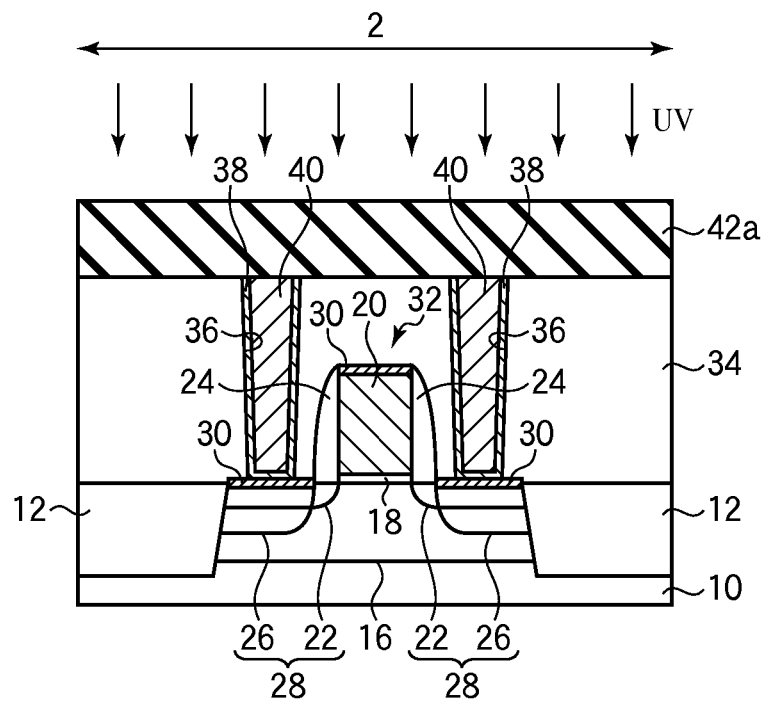

Then, UV (ultraviolet) is applied to the inter-layer insulation film 42 while being heated to thereby make UV cure (ultraviolet cure, ultraviolet processing) (see FIG. 3B). For the UV cure, a UV anneal system or others can be used. The UV cure can be made, e.g., by loading the semiconductor substrate 10 into the reaction chamber of the UV anneal system and, with a UV lamp or others, applying UV to the semiconductor substrate 10 being heated. The wavelength range of the UV lamp is set at, e.g., about 200-500 nm. The output of the UV lamp is set at, e.g., about 1800 W. The pressure inside the reaction chamber is set at, e.g., about 50 Torr. The gas to be fed into the reaction chamber is set at, e.g., He gas. The flow rate of the He gas is set at, e.g., about 7500 sccm. The heating temperature in applying UV, i.e., the substrate temperature is set at 350° C. or below. The substrate temperature is preferably in the range of 230-350° C. The substrate temperature here is, e.g., 230° C. The UV radiation period of time is set at, e.g., about 5 minutes. The UV cure made at the relatively low temperature can increase the Young's modulus of the inter-layer insulation film 42a without causing much increase of the film stress. That is, the inter-layer insulation film 42a can be cured without causing much increase of the film stress. The relative dielectric constant of the inter-layer insulation film 42a cannot be sufficiently lowered by such UV cure, because UV cure is made at relatively high temperatures. At the stage when the UV cure has finished, the relative dielectric constant of the inter-layer insulation film 42a is relatively high.

The reason why the relative dielectric constant of the inter-layer insulation film 42a is relatively high at the stage when the UV cure has finished will be as follows. That is, in the inter-layer insulation film 42a of SiOC, unnecessary substances such as silanol grounds, etc., will be contained. The desorption temperature of the silanol groups out of the inter-layer insulation film 42a will be about 400° C. or above. Accordingly, when the UV cure is made at 350° C. or below, the silanol groups remain in the inter-layer insulation film 42a. Thus, when the UV cure has been finished at below 350° C., the relative dielectric constant of the inter-layer insulation film 42a will be relatively high.

The substrate temperature is set at 350° C. or below for the following reason. That is, when the UV cure is made at a relatively high temperature, large stress is generated in the inter-layer insulation film 42. To cure the inter-layer insulation film 42 without generating large film stress, preferably, the UV cure is made at a relatively low temperature. The UV cure made at 350° C. or below can cure the inter-layer insulation film 42 while preventing the generation of large film stress. Accordingly, in the present embodiment, the substrate temperature is set at 350° C. or below.

On the other hand when the UV cure is made at a relatively low temperature, the inter-layer insulation film 42 cannot be sufficiently cured. Accordingly, it is preferable that the substrate temperature for the UV cure is not too low. The UV cure made at 230° C. or above can sufficiently cure the inter-layer insulation film 42. Accordingly, it is preferable that the substrate temperature in the UV cure is set at 230° C. or above.

Even when the substrate temperature for the UV cure is set at 230° C. or below, the inter-layer insulation film 42 can be cured to some extent. Accordingly, the substrate temperature for the UV cure may not be set essentially at 230° C. or above. In view of obtaining sufficient strength, it is preferable that the substrate temperature for the UV cure is not excessively low.

Next, helium (He) plasma is applied to the inter-layer insulation film 42a while being heated. Thus, He plasma processing (He plasma cure) is made (see FIG. 4A). For the He plasma processing, a plasma processing system, such as a plasma CVD system or others, for example, can be used. The He plasma processing can be made, e.g., by loading the semiconductor substrate 10 in the reaction chamber of the plasma processing system and applying He plasmas to the semiconductor substrate 10 being heated. The flow rate of the He gas to be fed into the reaction chamber is set at, e.g., about 9000 sccm. The pressure inside the reaction chamber is set at, e.g., about 8 Torr. The output of the plasmas is set at, e.g., about 200 W. The heating temperature in the He plasma processing, i.e., the substrate temperature, is set at the range of 100° C.-350° C. The substrate temperature is set at, e.g., 350° C. here. The He plasma applying period of time is set at, e.g., about 15 seconds.

The plasma processing with He, which is small atom and inactive, produces the effect of desorption of silanol groups, etc. out of the inter-layer insulation film 42a. Besides, even at a relatively low temperature of about 350° C., by the He plasma processing, silanol groups, etc., can be left out of the inter-layer insulation film 42a.

Thus, the He plasma processing can sufficiently decrease the relative dielectric constant of the inter-layer insulation film 42b. The He plasma processing, which is made at a relatively low temperature, does not much increase the film stress of the inter-layer insulation film 42b. That is, the He plasma processing is thus made, whereby the relative dielectric constant of the inter-layer insulation film 42b can be sufficiently lowered without causing much increase of the film stress. The He plasma processing does not substantially change the Young's modulus of the inter-layer insulation film 42b.

The substrate temperature is set at the range of 100-350° C. for the following reason. That is, when the He plasma processing is made at a relatively high temperature, large film stress is generated in the inter-layer insulation film 42a. To cure the inter-layer insulation film 42a without generating large film stress, it is preferable that the He plasma processing is made at a relatively low temperature. The He plasma processing made at 350° C. or below can cure the inter-layer insulation film while preventing the generation of large film stress in the inter-layer insulation film. Accordingly, in the present embodiment, the substrate temperature is set at 350° C. or below. On the other hand, the He plasma processing made at a relatively low temperature cannot sufficiently lower the relative dielectric constant of the inter-layer insulation film 42a. Accordingly, it is preferable that the substrate temperature in the He plasma processing is not too low. The He plasma processing at 100° C. or above can sufficiently decrease the relative dielectric constant of the inter-layer insulation film 42a. Thus, in the present embodiment, the substrate temperature in the He plasma processing is set at the range of 100-350° C.

Even when the substrate temperature for the He plasma processing is set at 100° C. or below, the relative dielectric constant of the inter-layer insulation film 42 can be made lowered to some extent. Accordingly, the substrate temperature in the He plasma processing may not be essentially 100° C. or above. In view of obtaining sufficient low relative dielectric constant, it is preferable that the substrate temperature in the He plasma processing is not excessively low.

As described above, according to the present embodiment, UV cure is made on the inter-layer insulation film 42 at a relatively low temperature, whereby the inter-layer insulation film 42a of high hardness can be obtained without causing much increase of the film stress. Since the temperature in the UV cure is relatively low, the relative dielectric constant of the inter-layer insulation film 42 does not become sufficiently low at the stage when the UV cure has finished. Accordingly, in the present embodiment, He plasma processing is made to thereby sufficiently lower the relative dielectric constant of the inter-layer insulation film 42a. The UV cure of even a relatively low temperature can sufficiently increase the hardness of the inter-layer insulation film. The He plasma processing of even a relatively low temperature can sufficiently lower the relative dielectric constant of the inter-layer insulation film. Thus, according to the present embodiment, the inter-layer insulation film 42b of high hardness and sufficiently low relative dielectric constant can be formed without much increasing the film stress.

The UV cure and the He plasma processing are thus made, whereby the inter-layer insulation film 42b can have a film stress of, e.g., 55 Mpa or below, a relative dielectric constant of, e.g., 2.7 or below and a Young's modulus of, e.g., 8 GPa or above.

Figure 4A:
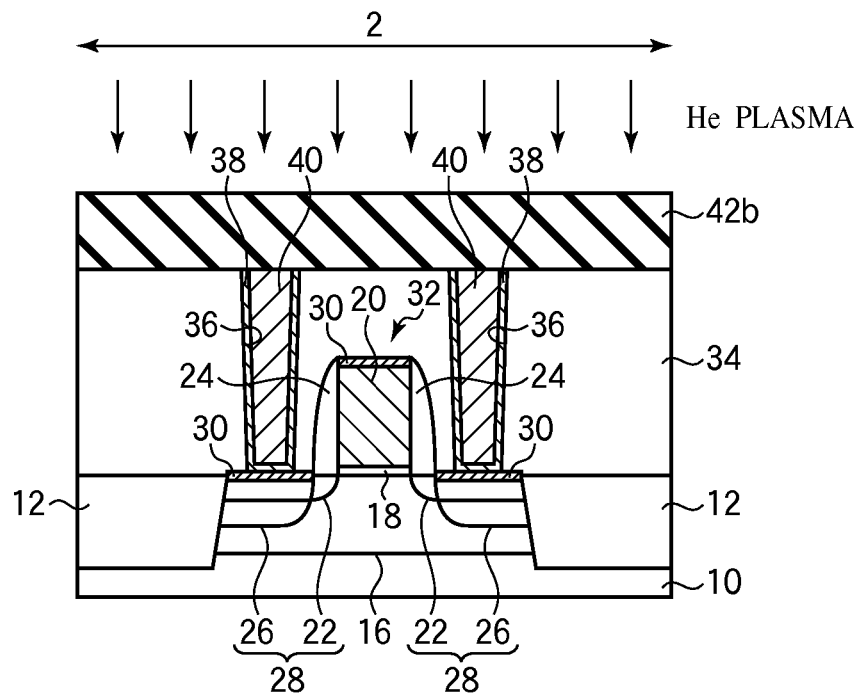
Figure 4B:
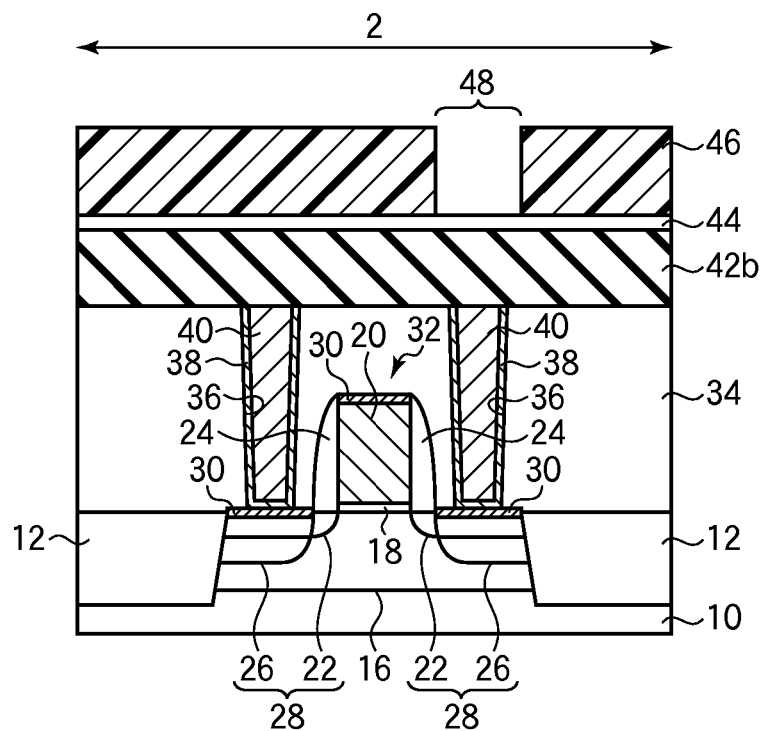

Then, on the entire surface, a cap film 44 of, e.g., a 15 to 60 nm-film thickness is formed by, e.g., plasma CVD (see FIG. 4B). As the cap film 44, silicon carbonate (SiC) film, silicon carbonate nitride (SiCN) film, BN film or others, for example can be used.

Next, on the entire surface, a photoresist film 46 is formed by, e.g., spin coating.

Next, openings 48 are formed in the photoresist film 46, by photolithography. The openings 48 are for forming trenches 50 for an interconnection 54 to be buried in the inter-layer insulation film 42 and the cap film 44.

Then, the cap film 44 and the inter-layer insulation film 42 are anisotropically etched by, e.g., plasma etching with the photoresist film 46 as the mask. As the etching gas, a fluorine content gas, for example, is used. Thus, the trenches 50 for the interconnections 24 to be buried in are formed in the inter-layer insulation film 42 and the cap film 44. At the bottoms of the trenches 50, the tops of the conductor plugs 40 are exposed.

Figure 5A:
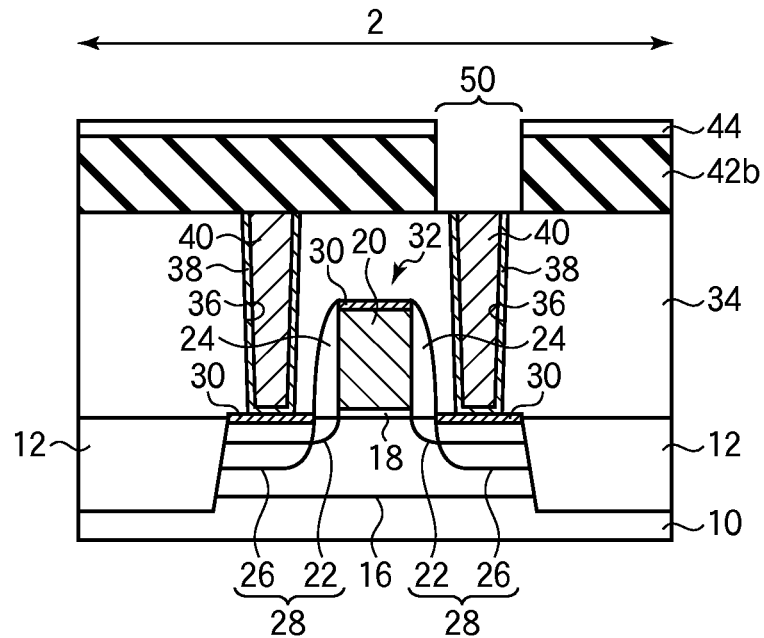

Hereafter, the photoresist film 46 is removed by, e.g. ashing (FIG. 5A). As the reaction gas for the ashing, oxygen gas, for example, is sued.

Next, on the entire surface, a barrier metal film 52 of, e.g., a 15 nm-film thickness is formed by, sputtering. As the barrier metal film 52, tantalum film, for example, is used. The barrier metal film 52 is for preventing the diffusion of the Cu (copper) in the interconnections 54 (see FIG. 6A) into the inter-layer insulation film 42, etc.

Next, on the entire surface, a seed layer (not illustrated) of, e.g., a 30 nm-film thickness is formed by, e.g., sputtering. As the material of the seed layer, Cu, for example, is used.

Figure 5B:
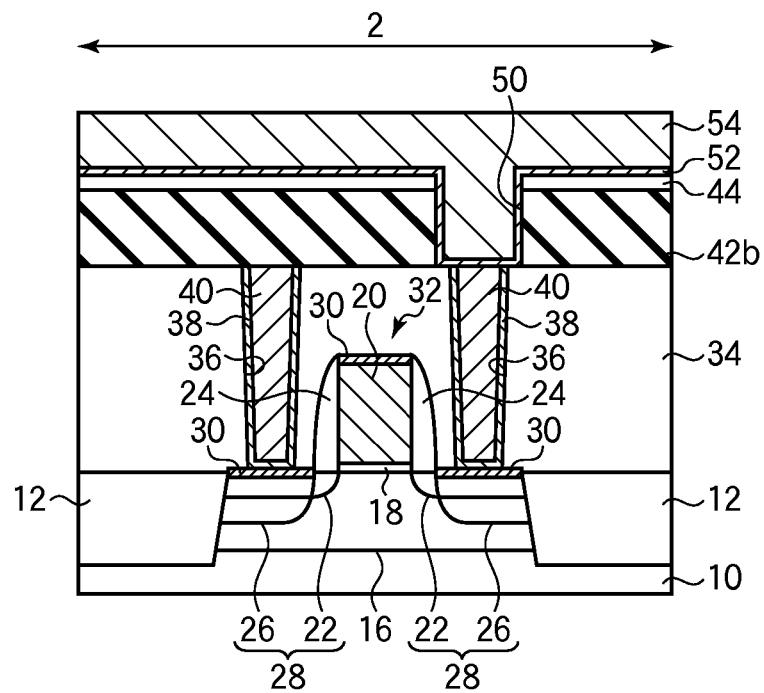

Next, a Cu layer 54 is formed by, e.g., electroplating (see FIG. 5B). The thickness of the Cu layer 54 is so set that the Cu layer 54 sufficiently fill the trenches 50.

Next, the Cu layer 54 and the barrier metal film 52 are polished by, e.g., CMP until the surface of the cap film 44 is exposed. Thus, the interconnections 54 of Cu are buried in the trenches 50 (see FIG. 6A).

As the material of the interconnections 54, Cu, for example, is used here but is not limited to Cu. Cu alloy or others, for example, may be used as the material of the interconnections 54.

Next, on the entire surface, an etching stopper film 56 of, e.g., a 15 to 60 nm-film thickness is formed by, e.g., plasma-enhanced CVD. As the etching stopper film 56, SiC film, SiCN film, BN film or others, for example, can be used.

Figure 6A:
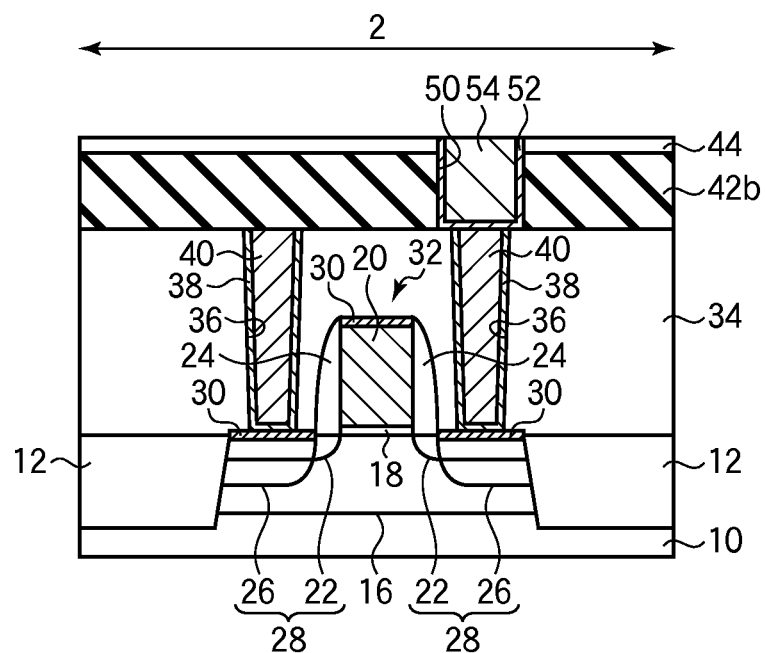
Figure 6B:
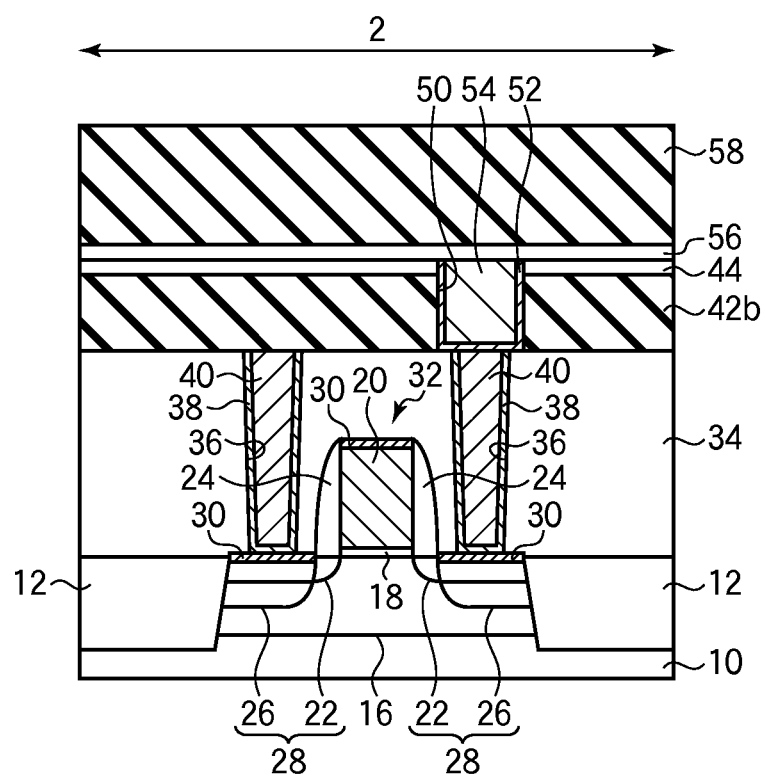

Then, on the entire surface, an inter-layer insulation film 58 of, e.g., a 150 to 250 nm-film thickness is formed by, e.g., CVD (see FIG. 6B). As the inter-layer insulation film 58, an inter-layer insulation film of the material having low dielectric constant is formed. Specifically, as the inter-layer insulation film 58, a film containing silicon, oxygen and carbon, for example, is formed. More specifically, as the inter-layer insulation film 58, SiOC film is formed. The inter-layer insulation film 58 can be formed in the same way as the processing for forming the inter-layer insulation film 42 described above with reference to FIG. 3A. That is, the gas to be fed into the film forming chamber is, e.g., TMSA gas, $O_2$ gas and $CO_2$ gas. The flow rate of the TMSA gas is set at, e.g., about 3 sccm. The flow rate of the $O_2$ gas is set at, e.g., about 200 sccm. The flow rate of the $CO_2$ gas is set at, e.g., about 5000 sccm. The pressure inside the film forming chamber is set at, e.g., about 10 mTorr. The substrate temperature is set at, e.g., 400° C.

Figure 7A:
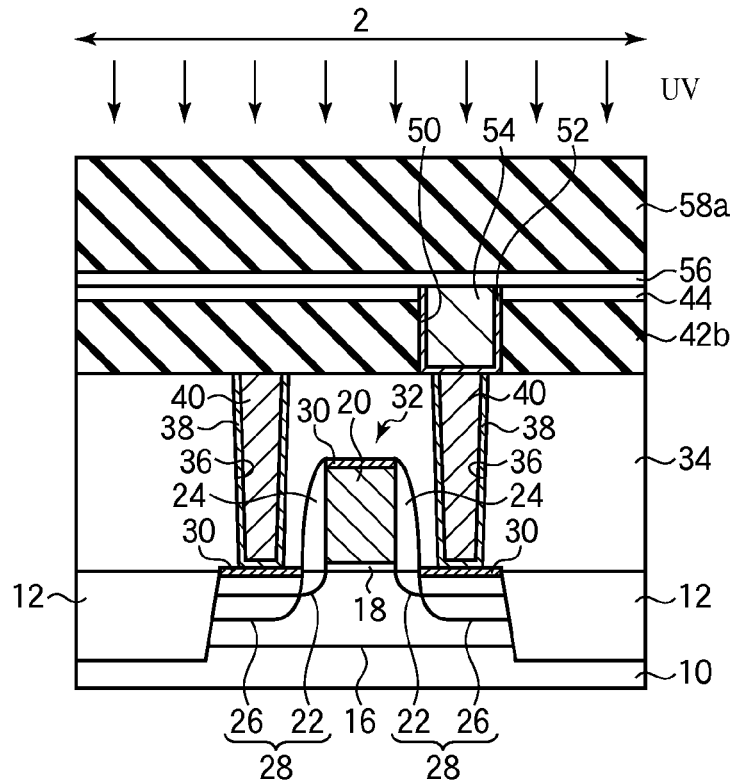

Then, UV is applied to the inter-layer insulation film 58 being heated to thereby make UV cure (see FIG. 7A). The UV cure on the inter-layer insulation film 58 can be made in the same way as the UV cure made on the inter-layer insulation film 42 described above with reference to FIG. 3B. However, for the inter-layer insulation film 58, which is thicker than the inter-layer insulation film 42, it is possible that the UV cure period of time is set longer, and the power of the UV lamp is set higher so that the UV cure can be sufficiently made on the inter-layer insulation film 58. The UV cure for the inter-layer insulation film 58 can be made with, e.g., a UV anneal system, as for the inter-layer insulation film 42. The main wavelength range of the UV lamp is set at, e.g., about 200-500 nm. The output of the UV lamp is set at, e.g., about 1800 W. The pressure inside the reaction chamber is set at, e.g., about 50 Torr. The gas to be fed into the reaction chamber is set at, e.g., He gas. The flow rate of the He gas is set at, e.g., about 7500 sccm. The heating temperature in the application of UV, i.e., the substrate temperature is set at 350° C. or below. Preferably, the substrate temperature is set at the range of 230-350° C. The substrate temperature is set at, e.g., 230° C. here. The UV application period of time is set at, e.g., about 180 seconds. The UV cure of the relatively low temperature can improve the Young's modulus of the inter-layer insulation film 58a without causing much increase of the film stress. That is, the inter-layer insulation film 58a can be cured without causing much increase of the film stress. At the stage when the UV cure has been finished, the relative dielectric constant of the inter-layer insulation film 58a is relatively high.

Figure 7B:
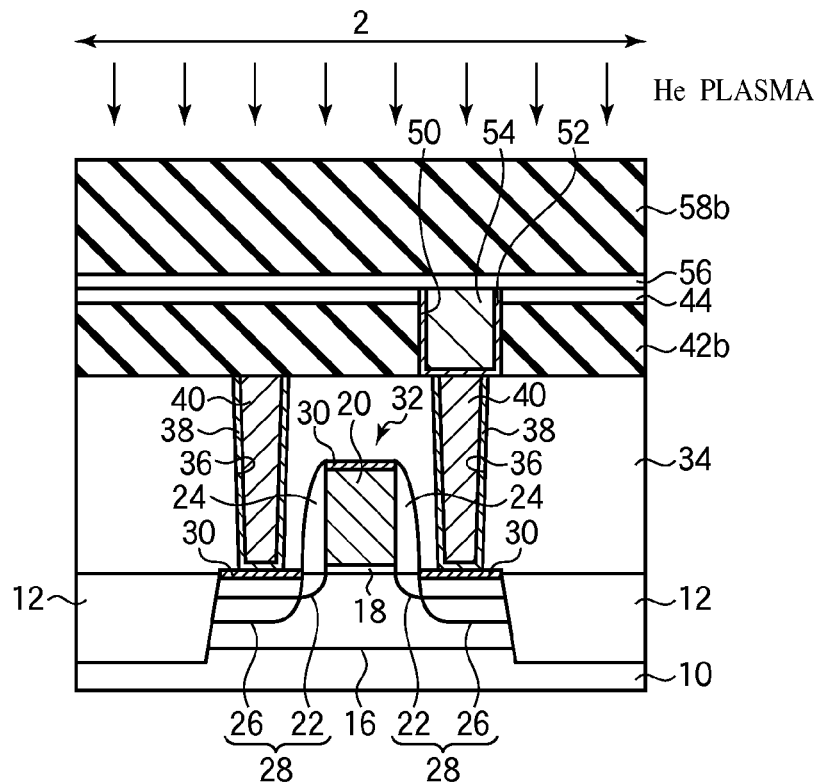

Then, He plasmas are applied to the inter-layer insulation film 58a being heated to thereby make He plasma processing (He plasma cure) (see FIG. 7B). The He plasma processing on the inter-layer insulation film 58a can be made in the same way as the He plasma processing on the inter-layer insulation film 42a described above. However, for the inter-layer insulation film 58a, which is thicker than the inter-layer insulation film 42a, it is possible to set the processing period of time longer, and the output of the plasmas is set higher so that the He plasma processing can be sufficiently made on the inter-layer insulation film 58a. The He plasma processing to the inter-layer insulation film 58a can be made with a plasma processing system, e.g., a plasma CVD system or others as is the He plasma processing for the inter-layer insulation film 42a. The flow rate of the He gas to be fed into the reaction chamber is set at, e.g., about 9000 sccm. The pressure inside the reaction chamber is set at, e.g., about 8 Torr. The output of the plasmas is set at, e.g., about 200 W. The heating temperature in the He plasma processing, i.e., the substrate temperature is set at the range of 100-350° C. The substrate temperature is set at, e.g., 350° C. here. The He plasma application period of time is set at, e.g., about 30 seconds. The He plasma processing can sufficiently lower the relative dielectric constant of the inter-layer insulation film 58b. The He plasma processing, which is made at the relatively low temperature, does not cause much increase of the film stress of the inter-layer insulation film 58b. That is, the He plasma processing is thus made, whereby the relative dielectric constant of the inter-layer insulation film 58b can be sufficiently lowered without causing much increase of the film stress. The He plasma processing does not substantially change the Young's modulus of the inter-layer insulation film 58b.

As described above, according to the present embodiment, the UV cure is made on the inter-layer insulation film 58 at the relatively low temperature, whereby the inter-layer insulation film 58a can have high hardness without causing much increase of the film stress. Because of the relative low temperature for the UV cure, the relative dielectric constant of the inter-layer insulation film 58a has not become sufficiently low at the stage when the UV cure has been finished. Next, the He plasma processing is made on the inter-layer insulation film 58a, whereby the relative dielectric constant of the inter-layer insulation film 58b can be sufficiently lowered. Both the UV cure and the He plasma processing are made at the relatively low temperature, whereby the inter-layer insulation film 58b can have high hardness and sufficiently low relative dielectric without causing much increase of the film stress.

The UV cure and the He plasma processing are thus made, whereby the inter-layer insulation film 58b of a film stress of, e.g., 55 MPa or below, a relative dielectric constant of, e.g., 2.7 or below and a Young's modulus of, e.g., 8 GPa or above can be formed.

Figure 8A:
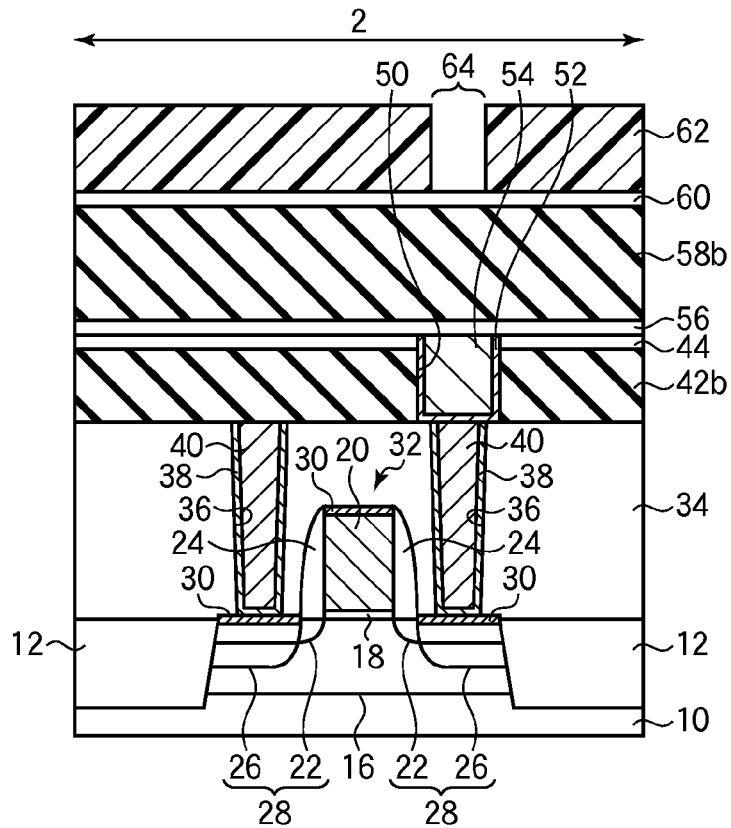

Then, on the entire surface, a cap film 60 of, e.g., a 15 to 60 nm-film thickness is formed by, e.g., plasma-enhanced CVD (see FIG. 8A). As the cap film 60, SiC film, SiCN film, BN film or others can be used.

Next, on the entire surface, a photoresist film 62 is formed by, e.g., spin coating.

Next, by photolithography, openings 64 are formed in the photoresist film 62. The openings 64 are for forming contact holes 66 in the inter-layer insulation film 58, etc (see FIG. 8B).

Then, the cap film 60 and the inter-layer insulation film 58 are etched by, e.g., plasma etching with the photoresist film 62 as the mask, whereby the contact holes 66 are formed. As the etching gas, a gas containing, e.g., $CF_4$ is used.

Hereafter, the photoresist film 62 is removed by, e.g., oxygen plasma.

Figure 8B:
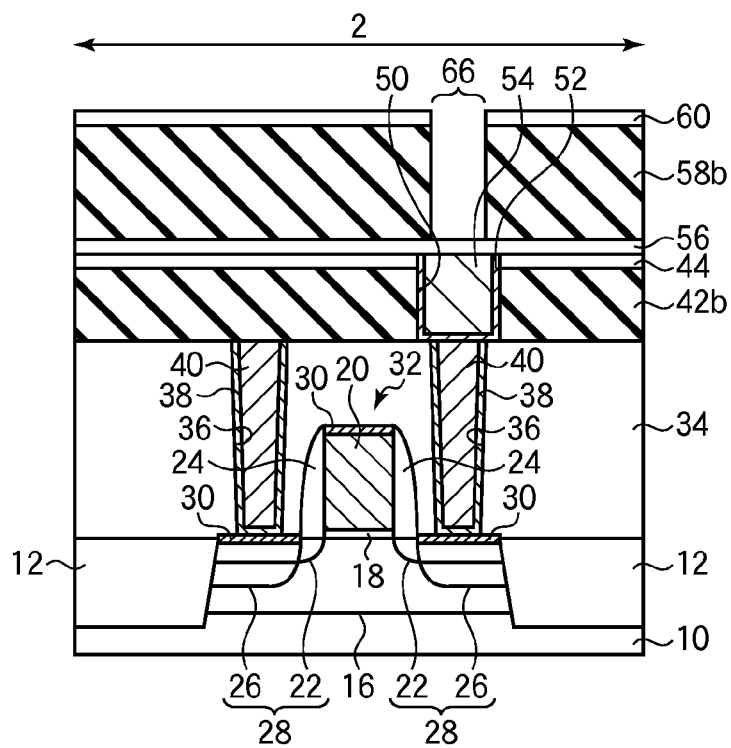

Thus, the contact holes 66 are formed in the cap film 60 and the inter-layer insulation film 58 (see FIG. 8B).

Figure 9A:
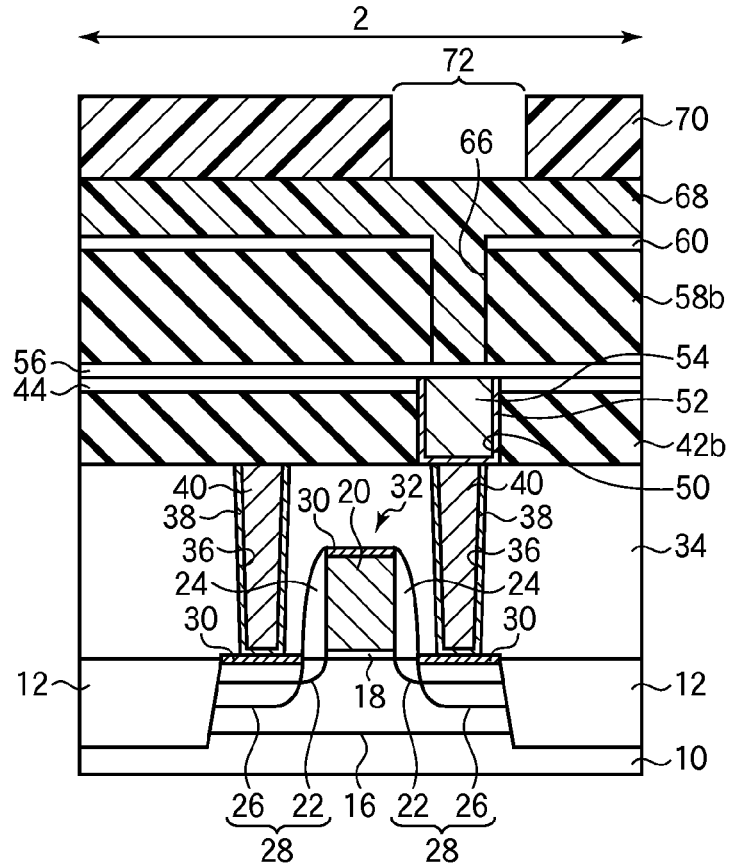

Next, on the entire surface, a thermosetting resin is applied by, e.g., spin coating to thereby form a resin film 68 (see FIG. 9A). Thus, the resin film 68 is formed in the contact holes 66 and on the cap film 60.

Next, thermal processing is made to cure the resin film 68. The thermal processing temperature is set at, e.g., about 250° C. The thermal processing period of time is set at, e.g., about 60 seconds.

Next, on the entire surface, a photoresist film 70 is formed by, e.g., spin coating.

Next, by photolithography, openings 72 are formed in the photoresist film 70. The openings 72 is for forming trenches 74 in the inter-layer insulation film 58, etc.

Next, the cap film 60 and the inter-layer insulation film 58 are etched by, e.g., plasma etching with the photoresist film 70 as the mask to thereby form trenches 74 in the inter-layer insulation film 58 and the cap film 60. The depth of the trenches 74 is set at, e.g., about 100 nm. As the etching gas, a fluorine-based gas, for example, is used. In this stage, the etching stopper film 56, which is protected by the resin film 68, is not etched.

Figure 9B:
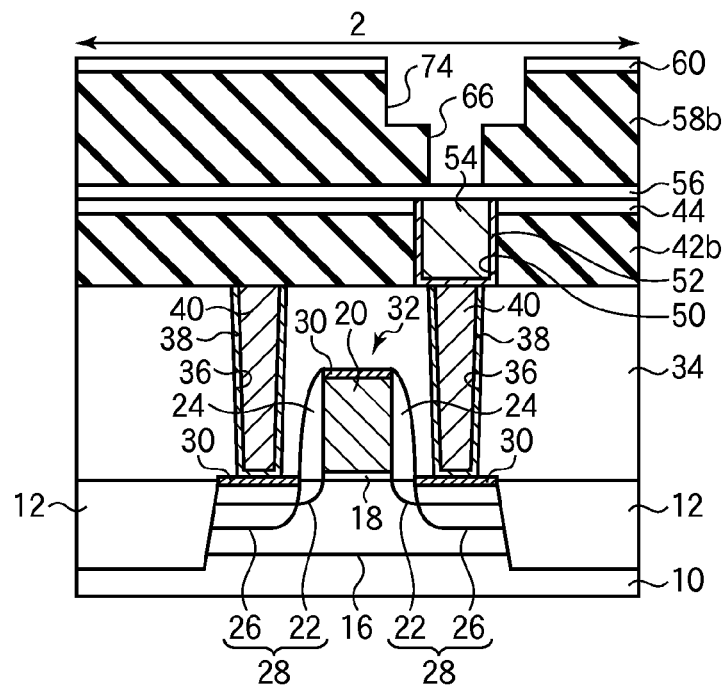

Next, the photoresist film 70 and the resin film 68 are removed by, e.g., oxygen plasma (see FIG. 9B).

Figure 10A:
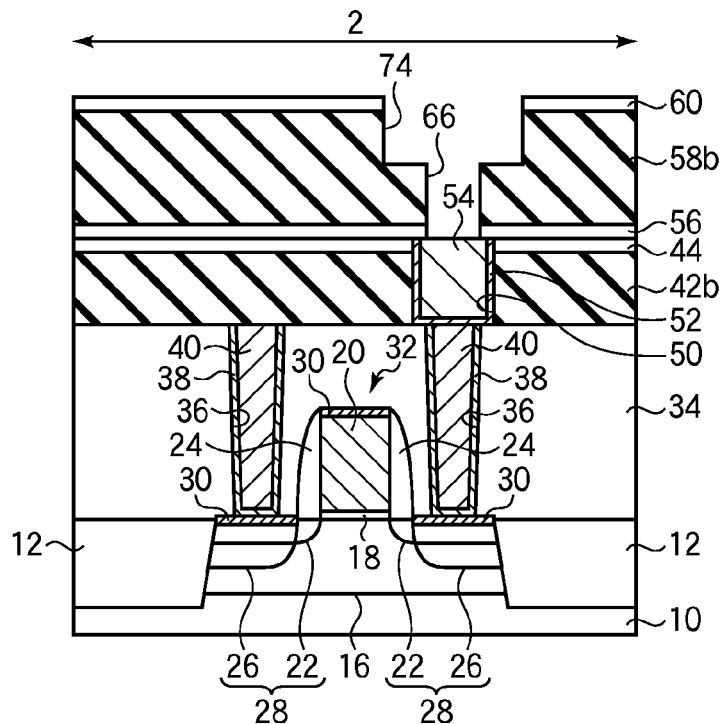

Next, by plasma etching, the photoresist film 56 exposed in the contact holes 66 is etched (see FIG. 10A). As the etching gas, the mixed gas containing, e.g., $CH_2F_2$ gas and $O_2$ gas is used. Thus, the contact holes 66 arrive at the upper surfaces of the interconnections 54. By this etching, the top of the cap film 60 is etched, and the trenches 74 become deeper.

Figure 10B:
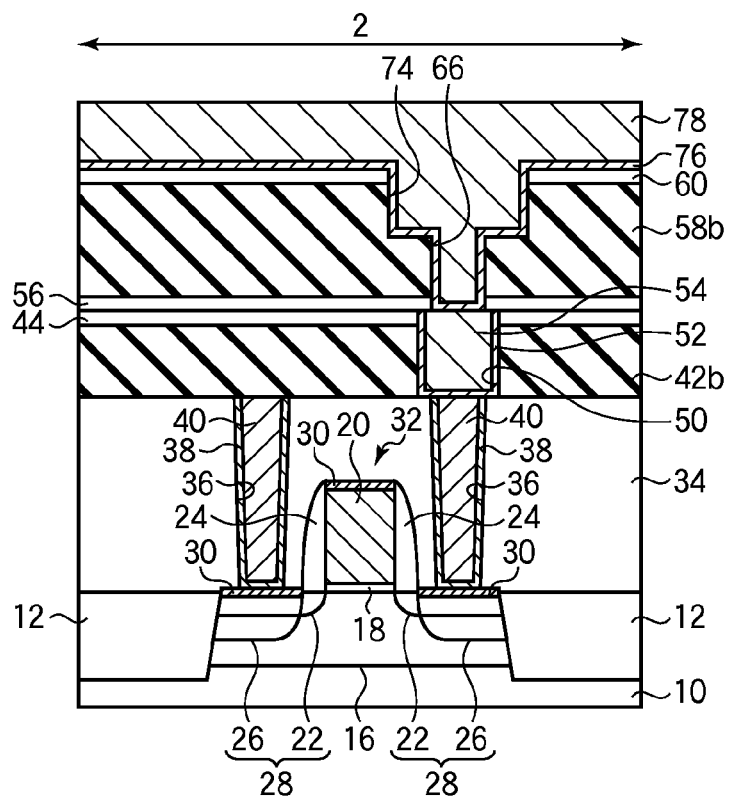
Figure 11:
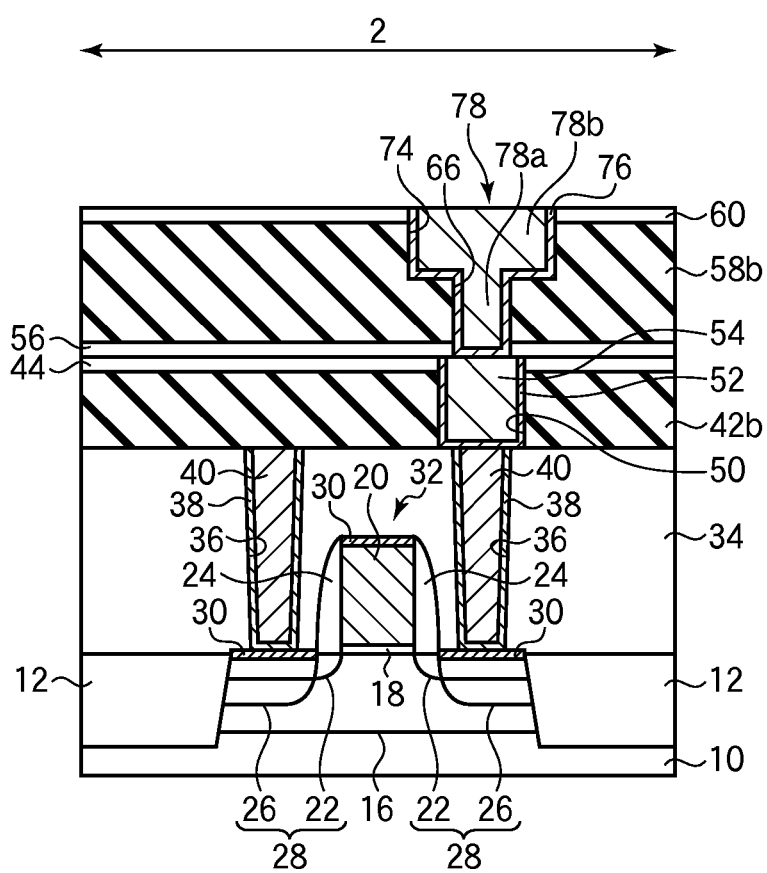

Then, on the entire surface, a barrier metal film 76 of, e.g., a 15 nm-film thickness is formed by, e.g., sputtering (see FIG. 10B). As the barrier metal film 76, tantalum film, for example, is used. The barrier metal film 76 is fore preventing the diffusion of the Cu in the Cu layer 78 into the inter-layer insulation film 58, etc.

Next, on the entire surface, a seed layer of, e.g., a 30 nm-film thickness (not illustrated) is formed by, e.g., sputtering. As the material of the seed layer, Cu, for example, is used.

Next, the Cu layer 78 is formed by, e.g., electroplating. The thickness of the Cu layer 78 is so set that the Cu layer 78 sufficiently fills the contact holes 66 and the trenches 74.

Then, the Cu layer 78 and the barrier metal film 76 are polished by, e.g., CMP until the surface of the cap film 60 is exposed. Thus, the Cu film 78 is filled in the trenches 74 and the contact holes 66. The parts of the Cu layer 78 buried in the contact holes 66 become conductor plugs 78a. The parts of the Cu layer 78 buried in the trenches 74 becomes interconnections 78b. Thus, the conductor plugs 78a and the interconnections 78b are formed integral by dual damascening (see FIG. 11).

The material of the interconnections 78a and the conductor plugs 78b is Cu here but is not essentially limited to Cu. As the material of the interconnections 78a and the conductor plugs 78b, Cu alloy or others may be used.

Thus, the semiconductor device of the present embodiment is manufactured.

[Evaluation Result]

Next, the evaluation result of the semiconductor device manufacturing method according to the present embodiment will be explained with reference to FIGS. 12A to 14C.

Figure 12A:
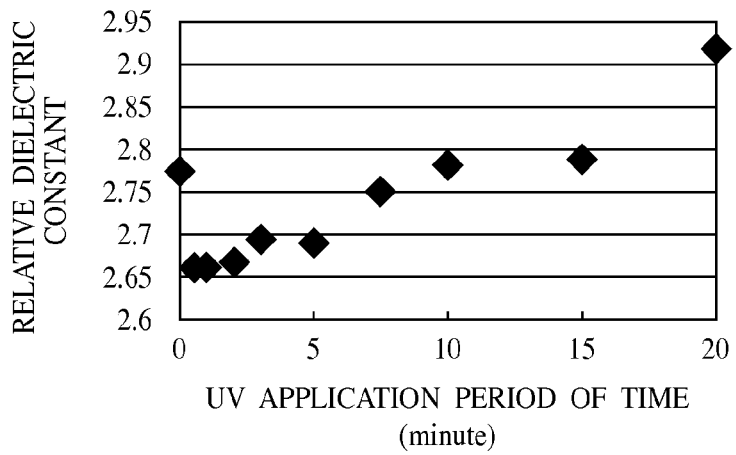
FIG. 12A is a graph of a relative dielectric constant given when UV cure is made at a substrate temperature of 400° C.
Figure 12B:
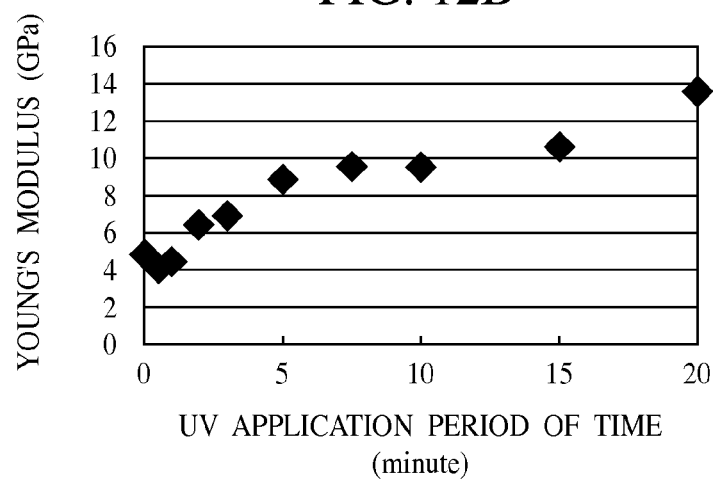
FIG. 12B is a graph of Young's modulus given when the UV cure is made at the substrate temperature of 400° C.
Figure 12C:
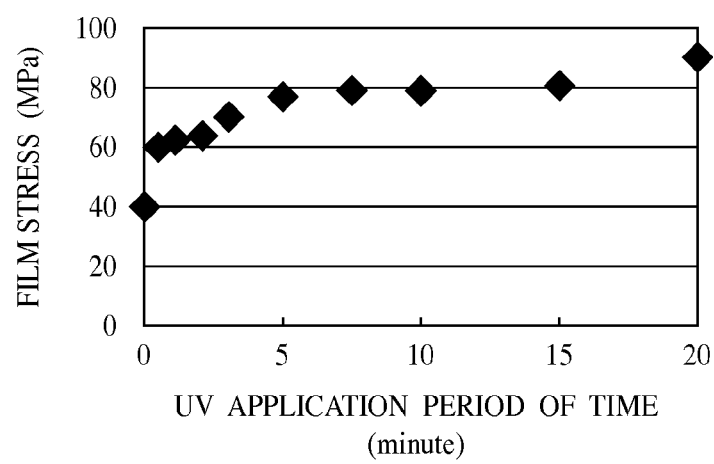
FIG. 12C is a graph of a film stress given when the UV cure is made at the substrate temperature of 400° C.

FIGS. 12A to 12C show the evaluation results of Control 1, that is, the graph of the relative dielectric constant, the Young's modulus and the film stress given when UV cure was made on an inter-layer insulation film of SiOC at 400° C. FIG. 12A is the graph of the relationships between the UV application period of time and the relative dielectric constant of the inter-layer insulation film. FIG. 12B is the graph of the relationships between the UV application period of time and the Young's modulus of the inter-layer insulation film. FIG. 12C is the graph of the relationships between the UV application period of time and the film stress of the inter-layer insulation film.

The film forming conditions for forming the inter-layer insulation film of SiOC are as follows. That is, as the CVD system for forming the inter-layer insulation film, VECTOR (R) by Novellus Systems, Inc. was used. As the substrate, a silicon substrate was used. As the gas fed into the reaction chamber, TMSA gas, $O_2$ gas and $CO_2$ gas were used. The flow rate of the TMSA gas was set at 2 sccm. The flow rate of the $O_2$ gas was set at 300 sccm. The flow rate of the $CO_2$ gas was set at 4000 sccm. The pressure inside the reaction chamber was set at 5.5 Torr. The applied high frequency power was set at 1900 W. The applied low frequency power was set at 300 W.

The conditions for the UV cure for the inter-layer insulation film of SiOC were as follows. That is, the system used in the UV cure was SOLA® by Novellus systems, Inc. As the UV lamp, a UV lamp whose main wavelength region is 200-500 nm was used. The output of the UV lamp was set at 1800 W. The pressure inside the reaction chamber was set at 50 Torr. As the gas to be fed into the reaction chamber, He gas was used. The flow rate of the He gas was set at 7500 sccm. The substrate temperature was set at 400° C. as described above.

As seen in FIG. 12A, as the UV cure period of time is longer, the relative dielectric constant of the inter-layer insulation film rises.

As seen in FIG. 12B, as the UV cure period of time is longer, the Young's modulus of the inter-layer insulation film rises.

As seen in FIGS. 12A and 12B, when the UV cure is made for about 5 minutes, relatively small relative dielectric constants will be obtained, and relatively high Young's modulus will be obtained.

However, as seen in FIG. 12C, the UV cure of about 5 minutes makes the film stress relatively large.

Based on this, it is seen that in Control 1, i.e., when the UV cure is made at the substrate temperature of 400° C., the film stress becomes relatively large.

Figure 13A:
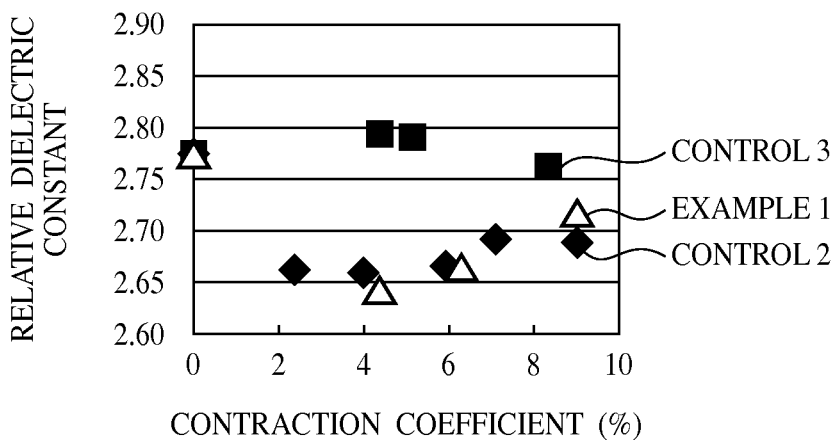
FIG. 13A is a graph of a result of comparison in a relative dielectric constant.
Figure 13B:
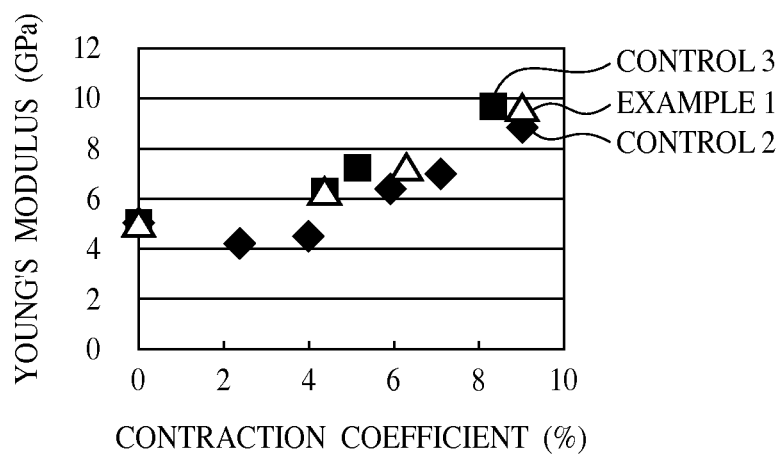
FIG. 13B is a graph of a result of comparison in the Young's modulus.
Figure 13C:
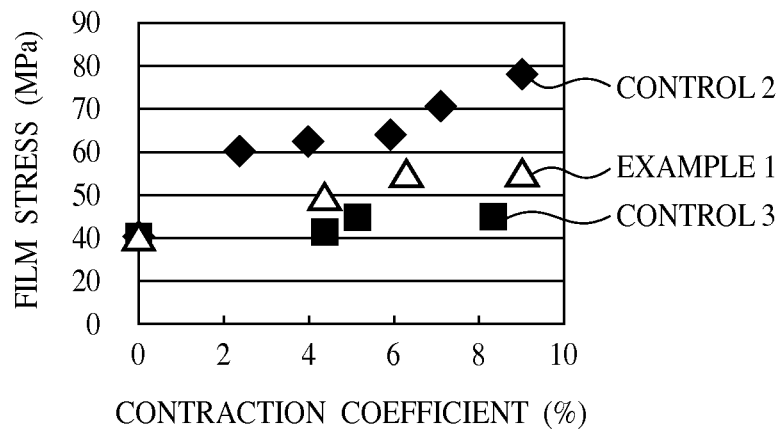
FIG. 13C is a graph of a result of comparison in the film stress.

FIGS. 13A to 13C are the graphs of the results of comparison among the relative dielectric constant, the Young's modulus and the film stress. FIG. 13A is the graph of the relationships between the contraction coefficient of the inter-layer insulation film and the relative dielectric constant thereof. FIG. 13B is the graph of the relationships between the contraction coefficient of the inter-layer insulation film and the Young's modulus thereof. FIG. 13C is the graph of the relationships between the contraction coefficient of the inter-layer insulation film and the film stress thereof. The plots of the ♦ mark indicate the result of Control 2, i.e., the case that the UV cure was made at the substrate temperature of 400° C. The plots of the ■ mark indicate the result of Control 3, i.e., the case that the UV cure was made at the substrate temperature of 230° C. The plots of the Δ mark indicate the result of Example 1, i.e., the case that the UV cure was made at the substrate temperature of 230° C. and then the He plasma processing was made.

In all the cases, the inter-layer insulation film of SiOC was formed in the same way as in Control 1 shown in FIG. 12.

In all the cases, the UV cure was made on the inter-layer insulation film of SiOC in the same way as in Control 1 shown in FIG. 12. In Control 2, however, the substrate temperature in the UV cure was set 400° C. In Control 3 and Example 1, the substrate temperature for the UV cure was set at 250° C.

In Example 1, the He plasma processing was made as follows. That is, the flow rate of the He gas was set at 9000 sccm. The pressure inside the reaction chamber was set at 8 Torr. The output of the plasmas was set at 200 W. The substrate temperature was set at 350° C. The He plasma application period of time was set at 15 seconds.

With the substrate temperature in the UV cure changed, the rate of the reaction taking place in the inter-layer insulation film much changes, and accordingly it is not easy to compare properties of the inter-layer insulation film in the graph with the UV application period of time taken on the horizontal axis. Then, in FIG. 13, the contraction coefficient of the inter-layer insulation film is taken on the horizontal axis.

As seen in FIG. 13B, in Example 1, relatively high Young's modulus can be obtained, as in Control 2. Based on this, the inter-layer insulation film can be sufficiently cured even when the substrate temperature in the UV cure is 230° C., which is relatively low, substantially as in Control 2, i.e., where the substrate temperature in the UV cure is 400° C.

As seen in FIG. 13C, in Example, 1, the film stress is sufficiently low in comparison with that of Control 2. Based on this, the film stress of the inter-layer insulation film can be decreased by setting relatively low the substrate temperature in the UV cure.

As seen in FIG. 13A, in Example 1, the relative dielectric constant is sufficiently low in comparison with that of Control 3. Based on this, it is seen that the relatively dielectric constant of the inter-layer insulation film can be lowered by making the He plasma processing even when the substrate temperature in the UV cure is set relatively low.

Based on these results, it is seen that the UV cure is made at a relatively low substrate temperature, and then the He plasma processing is made, whereby while the increase of the film stress is prevented, the inter-layer insulation film can be cured, and the relative dielectric constant of the inter-layer insulation film can be sufficiently lowered.

Figure 14A:
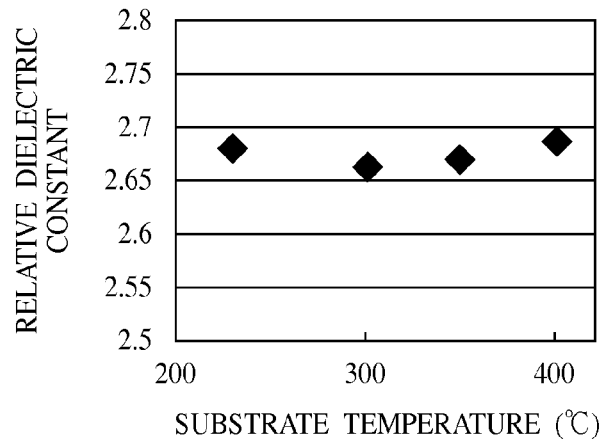
FIG. 14A is a graph of a relationship between the relative dielectric constant with the substrate temperature in the UV cure.
Figure 14B:
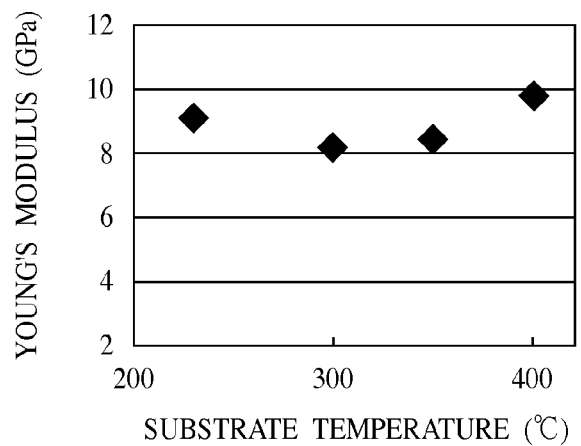
FIG. 14B is a graph of a relationship between the Young's modulus with the substrate temperature in the UV cure.
Figure 14C:
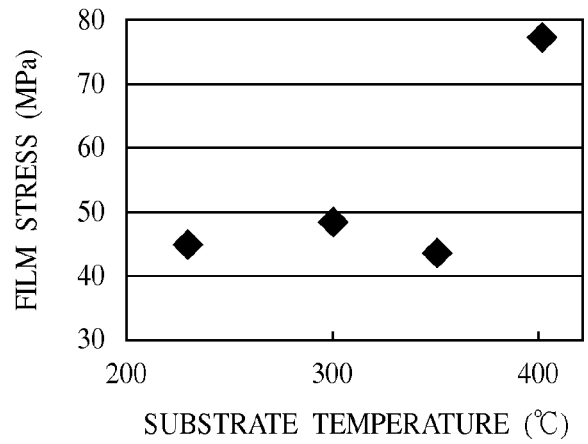
FIG. 14C is a graph of a relationship between the film stress with the substrate temperature in the UV cure.

FIG. 14 is the graph of the relationships of the substrate temperature in the UV cure with the relative dielectric constant, the young's modulus and the film stress. FIG. 14A is the graph of the relationships between the substrate temperature in the UV cure and the relative dielectric constant of the inter-layer insulation film. FIG. 14B is the graph of the relationships between the substrate temperature in the UV cure and the Young's modulus of the inter-layer insulation film. FIG. 14C is the graph of the relationships between the substrate temperature in the UV cure and the film stress of the inter-layer insulation film.

In all the cases, the He plasma processing was made after the UV cure has been made on the inter-layer insulation film. The conditions for the UV cure and the conditions for the He plasma process were the same as those of Example 1 described above. However, the substrate temperature was suitably set.

As seen in FIG. 14A, with the substrate temperature in the UV cure set in the range of 230° C.-350° C., relatively low relative dielectric constant can be obtained, as in the case where the substrate temperature in the UV cure is 400° C.

As seen in FIG. 14B, with the substrate temperature in the UV cure set in the range of 230° C.-350° C., relatively high Young's modulus can be obtained, as in the case where the substrate temperature in the UV cure is 400° C.

As seen in FIG. 14C, with the substrate temperature in the UV cure set in the range of 230° C.-350° C., the film stress is suppressed sufficiently small in comparison with the case where the substrate temperature in the UV cure is 400° C.

Based on the above, it is seen that the increase of the film stress of the inter-layer insulation film can be surely prevented by setting the substrate temperature in the UV cure at 230° C.-350° C.

As described above, in the present embodiment, the UV cure is made on the inter-layer insulation film of SiOC with the substrate temperature set at a relatively low temperature 350° C. or below. According to the present embodiment, in which the UV cure is made with the substrate temperature set at a relatively low, the hardness of the inter-layer insulation film can be increased while the increase of the film stress of the inter-layer insulation film is prevented. Because of the relatively low substrate temperature in the UV cure, the relative dielectric constant of the inter-layer insulation film has not been sufficiently lowered at the stage when the UV cure has been finished. To sufficiently lower the relative dielectric constant of the inter-layer insulation film, in the present embodiment, the He plasma processing is made on the inter-layer insulation film. In the present embodiment, by making the He plasma processing, the relative dielectric constant of the inter-layer insulation film can be sufficiently lowered. Besides, the He plasma processing, which can sufficiently lower the relative dielectric constant of the inter-layer insulation film even at a relatively low temperature, does not much increase the film stress in the He plasma processing. Thus, according to the present embodiment, while much increase of the film stress of the inter-layer insulation film is prevented, the inter-layer insulation film can be cured, and the relative dielectric constant of the inter-layer insulation film can be sufficiently lowered. Consequently, according to the present embodiment, semiconductor devices of high reliability and good electric characteristics can be provided.

Modified Embodiments

The present invention is not limited to the above-described embodiment and can cover other various modifications.

For example, in the above-described embodiment, as the inter-layer insulation film containing silicon and oxygen, SiOC film, for example, is formed, but SiOC film is not essential. The present semiconductor device manufacturing method is applicable widely to inter-layer insulation films containing silicon, carbon and oxygen. For example, the inter-layer insulation film may be SiOCH film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacturing method comprising:
    forming an inter-layer insulation film containing silicon, oxygen and carbon over a semiconductor substrate by chemical vapor deposition;
    making UV cure on the inter-layer insulation film being heated at a temperature of 350° C. or below after the forming the inter-layer insulation film;
    making helium plasma processing on the inter-layer insulation film after the UV cure;
    forming a cap film on the inter-layer insulation film after the helium plasma processing, a thickness of the cap film is thinner than a thickness of the inter-layer insulation film;
    forming a photoresist pattern on the cap film,
    forming a hole in the inter-layer insulation film using the photoresist pattern as a mask; and
    forming an interconnection in the hole,
    wherein a relative dielectric constant of the inter-layer insulation film is set to 2.7 or below by the helium plasma processing on the inter-layer insulation film.

2. The semiconductor device manufacturing method according to claim 1, wherein
    the inter-layer insulation film is silicon oxide carbide film.

3. The semiconductor device manufacturing method according to claim 1, wherein
    in the UV cure, the UV cure is made on the inter-layer insulation film being heated at a temperature in a range of 230° C.-350° C.

4. The semiconductor device manufacturing method according to claim 2, wherein
    in the UV cure, the UV cure is made on the inter-layer insulation film being heated at a temperature in a range of 230° C.-350° C.

5. The semiconductor device manufacturing method according to claim 1, wherein
    in the helium plasma processing, the helium plasma processing is made on the inter-layer insulation film being heated at a temperature of 350° C. or below.

6. The semiconductor device manufacturing method according to claim 2, wherein
    in the helium plasma processing, the helium plasma processing is made on the inter-layer insulation film being heated at a temperature of 350° C. or below.

7. The semiconductor device manufacturing method according to claim 3, wherein
    in the helium plasma processing, the helium plasma processing is made on the inter-layer insulation film being heated at a temperature of 350° C. or below.

8. The semiconductor device manufacturing method according to claim 4, wherein
    in the helium plasma processing, the helium plasma processing is made on the inter-layer insulation film being heated at a temperature of 350° C. or below.

9. The semiconductor device manufacturing method according to claim 5, wherein
    in the helium plasma processing, the helium plasma processing is made on the inter-layer insulation film being heated at a temperature in a range of 100° C.-350° C.

10. The semiconductor device manufacturing method according to claim 6, wherein
    in the helium plasma processing, the helium plasma processing is made on the inter-layer insulation film being heated at a temperature in a range of 100° C.-350° C.

11. The semiconductor device manufacturing method according to claim 7, wherein
    in the helium plasma processing, the helium plasma processing is made on the inter-layer insulation film being heated at a temperature in a range of 100° C.-350° C.

12. The semiconductor device manufacturing method according to claim 8, wherein
    in the helium plasma processing, the helium plasma processing is made on the inter-layer insulation film being heated at a temperature in a range of 100° C.-350° C.

13. A semiconductor device manufacturing method comprising:
    forming an inter-layer insulation film containing silicon, oxygen and carbon over a semiconductor substrate by chemical vapor deposition;
    making UV cure on the inter-layer insulation film being heated;
    making helium plasma processing on the inter-layer insulation film after the UV cure;
    forming a cap film directly on the inter-layer insulation film after the helium plasma processing;
    forming a photoresist pattern directly on the cap film;
    forming a hole in the inter-layer insulation film and the cap film by etching the inter-layer insulation film and the cap film using the photoresist pattern as a mask; and
    forming an interconnection in the hole.

14. The semiconductor device manufacturing method according to claim 13, wherein
    the inter-layer insulation film is silicon oxide carbide film.

15. The semiconductor device manufacturing method according to claim 13, wherein
in the UV cure, the UV cure is made on the inter-layer insulation film being heated at a temperature in a range of 230° C.-350° C.

16. The semiconductor device manufacturing method according to claim 14, wherein
in the UV cure, the UV cure is made on the inter-layer insulation film being heated at a temperature in a range of 230° C.-350° C.

17. The semiconductor device manufacturing method according to claim 13, wherein
in the helium plasma processing, the helium plasma processing is made on the inter-layer insulation film being heated at a temperature of 350° C. or below.

18. The semiconductor device manufacturing method according to claim 14, wherein
in the helium plasma processing, the helium plasma processing is made on the inter-layer insulation film being heated at a temperature of 350° C. or below.

19. The semiconductor device manufacturing method according to claim 15, wherein
in the helium plasma processing, the helium plasma processing is made on the inter-layer insulation film being heated at a temperature of 350° C. or below.

* * * * *